(12) United States Patent
Mantese et al.

(10) Patent No.: US 11,937,031 B2
(45) Date of Patent: *Mar. 19, 2024

(54) REMOTE COMMUNICATION AND POWERED SENSING/CONTROL/IDENTIFICATION DEVICES USING HIGH TEMPERATURE COMPATIBLE SEMICONDUCTOR MATERIALS

(71) Applicant: RTX Corporation, Farmington, CT (US)

(72) Inventors: Joseph V. Mantese, Ellington, CT (US); Kurt J. Sobanski, Glastonbury, CT (US)

(73) Assignee: RTX CORPORATION, Farmington, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/371,315

(22) Filed: Jul. 9, 2021

(65) Prior Publication Data

US 2021/0345021 A1  Nov. 4, 2021

Related U.S. Application Data

(63) Continuation of application No. 16/572,046, filed on Sep. 16, 2019, now Pat. No. 11,089,389, which is a (Continued)

(51) Int. Cl.
*H04Q 9/00* (2006.01)
*F01D 21/00* (2006.01)
(Continued)

(52) U.S. Cl.
CPC .............. *H04Q 9/00* (2013.01); *F01D 21/003* (2013.01); *F02C 3/04* (2013.01); *F02C 9/00* (2013.01);
(Continued)

(58) Field of Classification Search
CPC . H04Q 9/00; H04Q 1/116; H04Q 1/28; H04Q 2209/40; F01D 21/003; F02C 3/04;
(Continued)

(56) References Cited

U.S. PATENT DOCUMENTS 7,464,603 B2   12/2008   Bauer et al.
8,111,161 B2    2/2012   Lee
(Continued)

FOREIGN PATENT DOCUMENTS

CN   102169104 A    8/2011
CN   102735326 A   10/2012
(Continued)

OTHER PUBLICATIONS

EP App. No. 17188888.6 Search Report; dated Feb. 1, 2018; 11 pgs.
(Continued)

*Primary Examiner* — Mahmoud S Ismail
(74) *Attorney, Agent, or Firm* — CANTOR COLBURN LLP

(57) ABSTRACT

A system includes a network of a plurality of sensing/control/identification devices distributed throughout a machine, each of the sensing/control/identification devices associated with at least one sub-system component of the machine and operable to communicate through a plurality of electromagnetic signals. Shielding surrounds at least one of the sensing/control/identification devices to contain the electromagnetic signals proximate to the at least one sub-system component. A communication path is integrally formed in a component of the machine to route a portion of the electromagnetic signals through the component and a remote processing unit operable to communicate with the network of the sensing/control/identification devices through the electromagnetic signals, wherein at least a portion of the sensing/control/identification devices comprise a wide band
(Continued)

gap semiconductor device and wherein at least a portion of the sensing/control/identification devices comprise an on-chip antenna.

20 Claims, 9 Drawing Sheets

Related U.S. Application Data continuation of application No. 15/255,423, filed on Sep. 2, 2016, now Pat. No. 10,419,831, which is a continuation-in-part of application No. 15/114,234, filed as application No. PCT/US2015/016761 on Feb. 20, 2015, now Pat. No. 10,080,068.

(60) Provisional application No. 61/946,064, filed on Feb. 28, 2014.

(51) Int. Cl.

| | | |
|---|---|---|
| *F02C 3/04* | (2006.01) | |
| *F02C 9/00* | (2006.01) | |
| *F02K 3/04* | (2006.01) | |
| *F02K 3/06* | (2006.01) | |
| *G01M 15/14* | (2006.01) | |
| *G06K 7/10* | (2006.01) | |
| *G07C 5/00* | (2006.01) | |
| *G07C 5/08* | (2006.01) | |
| *H01P 3/12* | (2006.01) | |
| *H01P 5/02* | (2006.01) | |
| *H01Q 5/55* | (2015.01) | |
| *H04B 1/02* | (2006.01) | |
| *H04B 1/3822* | (2015.01) | |
| *H04B 15/02* | (2006.01) | |
| *H04L 12/40* | (2006.01) | |
| *H04L 41/0803* | (2022.01) | |
| *H04Q 1/02* | (2006.01) | |
| *H04Q 1/28* | (2006.01) | |
| *H05K 9/00* | (2006.01) | |
| *H04L 67/10* | (2022.01) | |
| *H04L 67/12* | (2022.01) | |
| *H04W 84/12* | (2009.01) | |
| *H04W 84/18* | (2009.01) | |

(52) U.S. Cl.
CPC .................. *F02K 3/04* (2013.01); *F02K 3/06* (2013.01); *G01M 15/14* (2013.01); *G06K 7/10188* (2013.01); *G07C 5/008* (2013.01); *G07C 5/0808* (2013.01); *H01P 3/122* (2013.01); *H01P 5/02* (2013.01); *H01Q 5/55* (2015.01); *H04B 1/02* (2013.01); *H04B 1/3822* (2013.01); *H04B 15/02* (2013.01); *H04B 15/025* (2013.01); *H04L 12/40045* (2013.01); *H04L 41/0803* (2013.01); *H04Q 1/116* (2013.01); *H04Q 1/28* (2013.01); *H05K 9/0081* (2013.01); *F05D 2220/32* (2013.01); *F05D 2220/323* (2013.01); *F05D 2260/80* (2013.01); *F05D 2270/54* (2013.01); *F05D 2270/80* (2013.01); *H04L 2012/40273* (2013.01); *H04L 67/10* (2013.01); *H04L 67/12* (2013.01); *H04Q 2209/40* (2013.01); *H04W 84/12* (2013.01); *H04W 84/18* (2013.01)

(58) Field of Classification Search
CPC .... F02C 9/00; F02K 3/04; F02K 3/06; G01M 15/14; G06K 7/10188; G07C 5/008; G07C 5/0808; H01P 3/122; H01P 5/02; H01Q 5/55; H04B 1/02; H04B 1/3822; H04B 15/02; H04B 15/025; H04L 12/40045; H04L 41/0803; H04L 67/10; H04L 67/12; H04L 2012/40273; H05K 9/0081; F05D 2220/32; F05D 2220/323; F05D 2260/80; F05D 2270/54; F05D 2270/80; H04W 84/12; H04W 84/18
USPC .......................................................... 701/100
See application file for complete search history.

(56) References Cited

U.S. PATENT DOCUMENTS

| | | |
|---|---|---|
| 8,947,892 B1 | 2/2015 | Lam |
| 9,685,299 B2 | 6/2017 | Nakagawa |
| 9,986,310 B2 | 5/2018 | Sobanski et al. |
| 10,051,345 B2 | 8/2018 | Mantese et al. |
| 10,057,663 B2 | 8/2018 | Sobanski et al. |
| 10,091,562 B2 | 10/2018 | Mantese et al. |
| 10,419,831 B2 | 9/2019 | Mantese et al. |
| 10,469,920 B2 | 11/2019 | Zacchio et al. |
| 10,531,166 B2 | 1/2020 | Mantese et al. |
| 2005/0040934 A1 | 2/2005 | Shanton |
| 2006/0270354 A1 | 11/2006 | De La Chapelle et al. |
| 2007/0108770 A1 | 5/2007 | Riesberg |
| 2007/0199989 A1 | 8/2007 | Piety et al. |
| 2008/0035954 A1* | 2/2008 | Nozaki ............... H01L 29/7787 257/E27.128 |
| 2008/0055047 A1 | 3/2008 | Osada et al. |
| 2010/0049377 A1* | 2/2010 | Scheid .................... F01D 17/02 701/100 |
| 2010/0101206 A1 | 4/2010 | Haehner et al. |
| 2010/0177750 A1 | 7/2010 | Essinger et al. |
| 2010/0231407 A1 | 9/2010 | Carr |
| 2011/0075747 A1 | 3/2011 | Mihota |
| 2011/0133950 A1* | 6/2011 | Subramanian ............ F23R 3/00 340/870.28 |
| 2011/0285312 A1* | 11/2011 | Choutov ............... H05B 45/375 336/200 |
| 2011/0300809 A1* | 12/2011 | Gordiyenko ........... H04B 17/23 455/67.12 |
| 2011/0309937 A1 | 12/2011 | Bunza et al. |
| 2012/0121383 A1 | 5/2012 | Michligk |
| 2012/0183091 A1 | 7/2012 | Komori |
| 2012/0242351 A1 | 9/2012 | Hochreutiner et al. |
| 2012/0307720 A1 | 12/2012 | Madsen et al. |
| 2013/0231854 A1* | 9/2013 | Rovik ................. B60R 16/0236 701/1 |
| 2013/0258541 A1 | 10/2013 | Knobloch et al. |
| 2013/0264110 A1 | 10/2013 | Willmot et al. |
| 2013/0266154 A1 | 10/2013 | McCormack et al. |
| 2013/0291085 A1 | 10/2013 | Chong et al. |
| 2013/0306737 A1 | 11/2013 | Freeman |
| 2013/0328641 A1 | 12/2013 | Komori et al. |
| 2013/0332010 A1 | 12/2013 | Ziarno |
| 2013/0335197 A1 | 12/2013 | Oder et al. |
| 2014/0050485 A1 | 2/2014 | Masarik et al. |
| 2014/0052410 A1 | 2/2014 | Tralshawala et al. |
| 2014/0178513 A1 | 6/2014 | Matthews |
| 2014/0225634 A1 | 8/2014 | Broillet |
| 2014/0376589 A1 | 12/2014 | Karp et al. |
| 2015/0022373 A1 | 1/2015 | Bommer et al. |
| 2016/0118703 A1 | 4/2016 | Hejase et al. |
| 2016/0209264 A1 | 7/2016 | Berkcan et al. |
| 2016/0314631 A1 | 10/2016 | Sobanski |
| 2016/0369650 A1 | 12/2016 | Sobanski et al. |
| 2016/0369651 A1 | 12/2016 | Sobanski et al. |
| 2016/0370256 A1 | 12/2016 | Zacchio et al. |
| 2016/0371896 A1 | 12/2016 | Mantese et al. |
| 2016/0373836 A1 | 12/2016 | Sobanski et al. |
| 2017/0134154 A1 | 5/2017 | Pratt et al. |

(56) References Cited

U.S. PATENT DOCUMENTS

2018/0262820 A1 9/2018 Mantese et al.
2020/0145738 A1 5/2020 Mantese et al.

FOREIGN PATENT DOCUMENTS

| EP | 2154552 A1 | 2/2010 |
|----|------------|--------|
| EP | 2728818 A1 | 5/2014 |
| EP | 2913808 | 9/2015 |
| EP | 2927648 A1 | 10/2015 |
| EP | 2961087 A1 | 12/2015 |
| GB | 886127 | 1/1962 |
| WO | 9930006 A3 | 6/1999 |
| WO | 0079369 | 12/2000 |
| WO | 0116554 A2 | 3/2001 |
| WO | 2005096571 A1 | 10/2005 |
| WO | 2014094982 A1 | 6/2014 |
| WO | 2014121338 A1 | 8/2014 |
| WO | 2014121402 A1 | 8/2014 |
| WO | 2015073852 A1 | 5/2015 |
| WO | 2015130563 A1 | 9/2015 |
| WO | 2016034773 A1 | 3/2016 |

OTHER PUBLICATIONS

EP Application No. 15754972.6 Extended European Search Report dated Nov. 10, 2017, 8 pages.
EP Application No. 17188879.5 EP Search Report dated Jan. 18, 2018, 9 pages.
EP Applicaton No. 17188885.2 EP Search Report dated Jan. 18, 2018, 9 pages.
European Office Action for European Application No. 17188855.2; Application Filing Date: Aug. 31, 2017; dated Feb. 25, 2021; 6 pages.
European Office Action for European Application No. 17188888.6; Application Filing Date: Aug. 31, 2017; dated Feb. 26, 2021; 6 pages.
European Office Action for European Application No. 17189173.2; Application Filing Date: Sep. 4, 2017; dated Feb. 24, 2021; 8 pages.
European Search Report for European Application No. 1718238.3 dated Feb. 16, 2018, 41 pages.
European Search Report for European Application No. 17189199.7 dated Jan. 5, 2018, 8 pages.
European Search Report for European Patent Application No. 17188894.4 dated Jan. 18, 2018, 8 pages.
European Search Report for European Patent Application No. 17189173.2 dated Jan. 19, 2018, 10 pages.
European Search Report, European Application No. 17188875.3, dated Jan. 30, 2018, European Patent Office; European Search Report 5 pages.
European Search Report, European Application No. 17188883.7, dated Jan. 23, 2018, European Patent Office; European Search Report 8 pages.
Extended European Search Report, EP Application No. 17189235.9, dated Jan. 19, 2018, 21 pages.
International Application No. PCT/US2015/016761 International Search Report and Written Opinion dated May 28, 2015, 12 pages.
Lee J W, et al., "A Technique to build a secret key in integrated circuits for identification and authentication applications", Symposium on VLSI Circuits Digest of Technical Papers, Jun. 17, 2004, pp. 176-179, XP-002420397.
Ranasinghe D C et al., "Security and Privacy Solutions for Low-Cost RFID Systems", ISSNIP-IEEE, Dec. 14, 2004, pp. 337-342, DOI 10.1109/ISSNIP.2004.1417485.
Strunk, et al. "The Elements of Style", 3rd Edition, 1979; 3 pages.
European Search Report for European Application No. 17189238.3; Application Filing Date: Sep. 4, 2017; dated Feb. 26, 2021; 6 pages.
European Office Action for European Application No. 17188894.4; Application Filing Date: Aug. 31, 2017; dated Feb. 25, 2021; 5 pages.

* cited by examiner

REMOTE COMMUNICATION AND POWERED SENSING/CONTROL/IDENTIFICATION DEVICES USING HIGH TEMPERATURE COMPATIBLE SEMICONDUCTOR MATERIALS

CROSS-REFERENCE TO RELATED APPLICATIONS

This Application is a continuation of U.S. patent application Ser. No. 16/572,046 filed on Sep. 16, 2019, which is a continuation of U.S. Pat. No. 10,419,831 issued on Sep. 17, 2019, which is a continuation-in-part of U.S. Pat. No. 10,080,068 issued on Sep. 18, 2018, which is a U.S. National Stage of Application No. PCT/US2015/016761 filed on Feb. 20, 2015, which claims the benefit of U.S. Provisional Patent Application No. 61/946,064 filed on Feb. 28, 2014, the contents of each of these applications are incorporated herein by reference thereto.

BACKGROUND

This disclosure relates to electromagnetic communication, and more particularly to remote communication to and from and powering of sensing/control/identification devices that use high temperature semiconductor materials and devices to enable these systems.

A gas turbine engine typically includes a fan section, a compressor section, a combustor section and a turbine section. Air entering the compressor section is compressed and delivered into the combustor section where it is mixed with fuel and ignited to generate a high-speed exhaust gas flow. The high-speed exhaust gas flow expands through the turbine section to drive the compressor and the fan section. The compressor section typically includes low and high pressure compressors, and the turbine section includes low and high pressure turbines.

Detailed knowledge of gas turbine engine and other machinery operation for control or health monitoring requires sensing systems that need information from locations that are sometimes difficult to access due to moving parts, internal operating environment or machine configuration. The access limitations make wire routing bulky, expensive, and vulnerable to interconnect failures. The sensor and interconnect operating environments for desired sensor locations often exceed the capability of the interconnect systems. In some cases, cable cost, volume, and weight exceed the desired limits for practical applications.

Application of electromagnetic sensor technologies to address the wiring constraints faces the challenge of providing reliable communications in a potentially unknown environment with potential interference from internal or external sources. Particularly, where conventional semiconductor devices have limited functionality in high temperature applications.

BRIEF DESCRIPTION

In an embodiment, a system includes a network of a plurality of sensing/control/identification devices distributed throughout a machine, each of the sensing/control/identification devices associated with at least one sub-system component of the machine and operable to communicate through a plurality of electromagnetic signals. Shielding surrounds at least one of the sensing/control/identification devices to contain the electromagnetic signals proximate to the at least one sub-system component. A communication path is integrally formed in a component of the machine to route a portion of the electromagnetic signals through the component and a remote processing unit operable to communicate with the network of the sensing/control/identification devices through the electromagnetic signals, wherein at least a portion of the sensing/control/identification devices comprise a wide band gap semiconductor device.

In addition to one or more of the features described above, or as an alternative to any of the foregoing embodiments, the wide band gap semiconductor device includes silicon on insulator (SOI), silicon carbide (SiC), gallium nitride (GaN), boron nitride, aluminum nitride, or a combination comprising at least one of the foregoing.

In addition to one or more of the features described above, or as an alternative to any of the foregoing embodiments, the wide band gap semiconductor device operates at a temperature greater than 200 degrees C.

In addition to one or more of the features described above, or as an alternative to any of the foregoing embodiments, the wide band gap semiconductor device includes an integrated device having bipolar junction transistors, field effect transistors, or a combination comprising at least one of the foregoing.

In addition to one or more of the features described above, or as an alternative to any of the foregoing embodiments, the wide band gap semiconductor device includes a bipolar structure, MOSFET, JFET, light emitting diode, oscillator, diode or a combination comprising at least one of the foregoing.

In addition to one or more of the features described above, or as an alternative to any of the foregoing embodiments, the wide band gap semiconductor device is part of an integrated circuit.

In addition to one or more of the features described above, or as an alternative to any of the foregoing embodiments, the wide band gap semiconductor device includes SiC, GaN or a combination thereof.

According to an embodiment, systems for gas turbine engines are provided. The systems include a network of a plurality of sensing/control/identification devices distributed throughout the gas turbine engine, each of the sensing/control/identification devices associated with at least one sub-system component of the gas turbine engine and operable to communicate through a plurality of electromagnetic signals. Shielding surrounds at least one of the sensing/control/identification devices to contain the electromagnetic signals proximate to the at least one sub-system component. A communication path is integrally formed in a component of the gas turbine engine to route a portion of the electromagnetic signals through the component. The system also includes a remote processing unit operable to communicate with the network of the sensing/control/identification devices through the electromagnetic signals. At least a portion of the sensing/control/identification devices comprise a wide band gap semiconductor device.

In addition to one or more of the features described above, or as an alternative to any of the foregoing embodiments, the wide band gap semiconductor device includes silicon on insulator (SOI), silicon carbide (SiC), gallium nitride (GaN), boron nitride, aluminum nitride, or a combination comprising at least one of the foregoing.

In addition to one or more of the features described above, or as an alternative to any of the foregoing embodiments, the wide band gap semiconductor device operates at a temperature greater than 200 degrees C.

In addition to one or more of the features described above, or as an alternative to any of the foregoing embodiments, the wide band gap semiconductor device includes an integrated device having bipolar junction transistors, field effect transistors, or a combination comprising at least one of the foregoing.

In addition to one or more of the features described above, or as an alternative to any of the foregoing embodiments, the wide band gap semiconductor device includes a bipolar structure, MOSFET, JFET, light emitting diode, oscillator, diode or a combination comprising at least one of the foregoing.

In addition to one or more of the features described above, or as an alternative to any of the foregoing embodiments, the wide band gap semiconductor device is part of an integrated circuit.

In addition to one or more of the features described above, or as an alternative to any of the foregoing embodiments, the wide band gap semiconductor device includes SiC, GaN or a combination thereof.

According to an embodiment, a method of electromagnetic communication through a machine includes transmitting communication signals between a remote processing unit and a network of a plurality of control/sensing/identification devices in the machine using a plurality of electromagnetic signals. The plurality of electromagnetic signals provide power to the control/sensing devices. At least a portion of the control/sensing/identification devices comprise a wide band gap semiconductor device.

In addition to one or more of the features described above, or as an alternative to any of the foregoing embodiments, the wide band gap semiconductor device includes silicon on insulator (SOI), silicon carbide (SiC), gallium nitride (GaN), boron nitride, aluminum nitride, or a combination comprising at least one of the foregoing.

In addition to one or more of the features described above, or as an alternative to any of the foregoing embodiments, the wide band gap semiconductor device operates at a temperature greater than 200 degrees C.

In addition to one or more of the features described above, or as an alternative to any of the foregoing embodiments, the wide band gap semiconductor device comprises an integrated device having bipolar junction transistors, field effect transistors, or a combination comprising at least one of the foregoing.

In addition to one or more of the features described above, or as an alternative to any of the foregoing embodiments, the wide band gap semiconductor device is part of an integrated circuit.

In addition to one or more of the features described above, or as an alternative to any of the foregoing embodiments, the wide band gap semiconductor device comprises SiC, GaN or a combination thereof.

BRIEF DESCRIPTION OF THE DRAWINGS

The subject matter which is regarded as the present disclosure is particularly pointed out and distinctly claimed in the claims at the conclusion of the specification. The foregoing and other features, and advantages of the present disclosure are apparent from the following detailed description taken in conjunction with the accompanying drawings in which:

DETAILED DESCRIPTION

Figure 1:
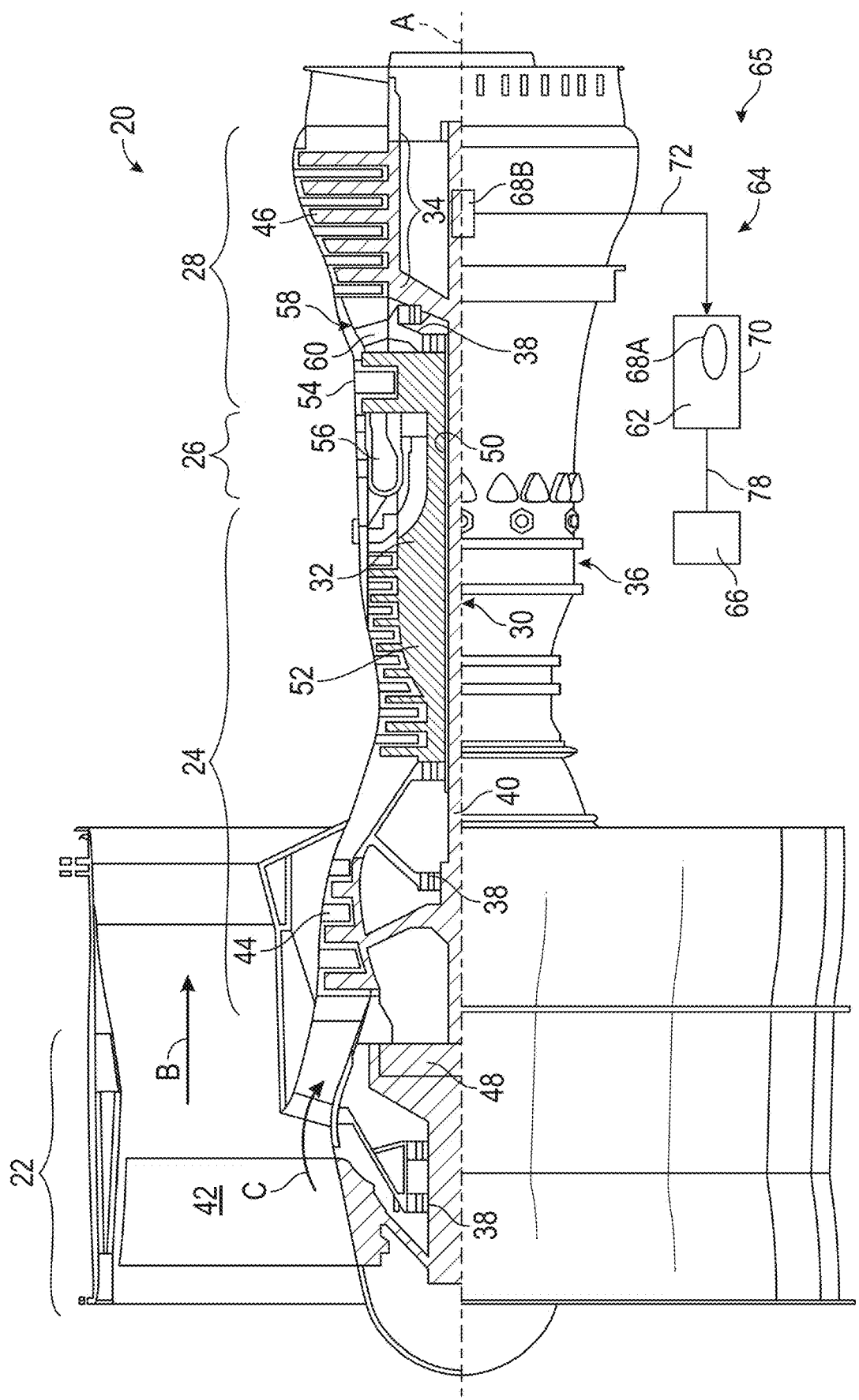
FIG. 1 is a cross-sectional view of a gas turbine engine.

Various embodiments of the present disclosure are related to electromagnetic communication in a machine. FIG. 1 schematically illustrates a gas turbine engine 20 as one example of a machine as further described herein. The gas turbine engine 20 is depicted as a two-spool turbofan that generally incorporates a fan section 22, a compressor section 24, a combustor section 26 and a turbine section 28. Alternative engines may include an augmentor section (not shown) among other systems or features. The fan section 22 drives air along a bypass flow path B in a bypass duct to provide a majority of the thrust, while the compressor section 24 drives air along a core flow path C for compression and communication into the combustor section 26 then expansion through the turbine section 28. Although depicted as a two-spool turbofan gas turbine engine in the disclosed non-limiting embodiment, it should be understood that the concepts described herein are not limited to use with two-spool turbofans as the teachings may be applied to other types of turbine engines including three-spool architectures or any other machine that requires sensors to operate with similar environmental challenges or constraints. Additionally, the concepts described herein may be applied to any machine or system comprised of control and/or health monitoring systems.

The exemplary engine 20 generally includes a low speed spool 30 and a high speed spool 32 mounted for rotation about an engine central longitudinal axis A relative to an engine static structure 36 via several bearing systems 38. It should be understood that various bearing systems 38 at various locations may alternatively or additionally be provided, and the location of bearing systems 38 may be varied as appropriate to the application.

The low speed spool 30 generally includes an inner shaft 40 that interconnects a fan 42, a first (or low) pressure compressor 44 and a first (or low) pressure turbine 46. The inner shaft 40 is connected to the fan 42 through a speed change mechanism, which in exemplary gas turbine engine 20 is illustrated as a geared architecture 48 to drive the fan 42 at a lower speed than the low speed spool 30. The high speed spool 32 includes an outer shaft 50 that interconnects a second (or high) pressure compressor 52 and a second (or high) pressure turbine 54. A combustor 56 is arranged in exemplary gas turbine engine 20 between the high pressure compressor 52 and the high pressure turbine 54. A mid-turbine frame 58 of the engine static structure 36 is arranged generally between the high pressure turbine 54 and the low pressure turbine 46. The mid-turbine frame 58 further supports bearing systems 38 in the turbine section 28. The inner shaft 40 and the outer shaft 50 are concentric and rotate via bearing systems 38 about the engine central longitudinal axis A which is collinear with their longitudinal axes.

The core airflow is compressed by the low pressure compressor 44 then the high pressure compressor 52, mixed and burned with fuel in the combustor 56, then expanded over the high pressure turbine 54 and low pressure turbine 46. The mid-turbine frame 58 includes airfoils 60 which are in the core airflow path C. The turbines 46, 54 rotationally drive the respective low speed spool 30 and high speed spool 32 in response to the expansion. It will be appreciated that each of the positions of the fan section 22, compressor section 24, combustor section 26, turbine section 28, and fan drive gear system 48 may be varied. For example, gear system 48 may be located aft of combustor section 26 or even aft of turbine section 28, and fan section 22 may be positioned forward or aft of the location of gear system 48.

The engine 20 in one example is a high-bypass geared aircraft engine. In a further example, the engine 20 bypass ratio is greater than about six (6), with an example embodiment being greater than about ten (10), the geared architecture 48 is an epicyclic gear train, such as a planetary gear system or other gear system, with a gear reduction ratio of greater than about 2.3 and the low pressure turbine 46 has a pressure ratio that is greater than about five. In one disclosed embodiment, the engine 20 bypass ratio is greater than about ten (10:1), the fan diameter is significantly larger than that of the low pressure compressor 44, and the low pressure turbine 46 has a pressure ratio that is greater than about five 5:1. Low pressure turbine 46 pressure ratio is pressure measured prior to inlet of low pressure turbine 46 as related to the pressure at the outlet of the low pressure turbine 46 prior to an exhaust nozzle. The geared architecture 48 may be an epicycle gear train, such as a planetary gear system or other gear system, with a gear reduction ratio of greater than about 2.3:1. It should be understood, however, that the above parameters are only exemplary of one embodiment of a geared architecture engine and that the present invention is applicable to other gas turbine engines including direct drive turbofans.

A significant amount of thrust is provided by the bypass flow B due to the high bypass ratio. The fan section 22 of the engine 20 is designed for a particular flight condition—typically cruise at about 0.8 Mach and about 35,000 feet (10.67 km). The flight condition of 0.8 Mach and 35,000 ft (10.67 km), with the engine at its best fuel consumption—also known as "bucket cruise Thrust Specific Fuel Consumption ('TSFC')"—is the industry standard parameter of lbm of fuel being burned divided by lbf of thrust the engine produces at that minimum point. "Low fan pressure ratio" is the pressure ratio across the fan blade alone, without a Fan Exit Guide Vane ("FEGV") system. The low fan pressure ratio as disclosed herein according to one non-limiting embodiment is less than about 1.45. "Low corrected fan tip speed" is the actual fan tip speed in ft/sec divided by an industry standard temperature correction of [(Tram ° R)/(518.7° R)]0.5. The "Low corrected fan tip speed" as disclosed herein according to one non-limiting embodiment is less than about 1150 ft/second (350 m/second).

The example gas turbine engine includes the fan 42 that comprises in one non-limiting embodiment less than about twenty-six (26) fan blades. In another non-limiting embodiment, the fan section 22 includes less than about twenty (20) fan blades. Moreover, in one disclosed embodiment the low pressure turbine 46 includes no more than about six (6) turbine rotors schematically indicated at 34. In another non-limiting example embodiment the low pressure turbine 46 includes about three (3) turbine rotors. A ratio between the number of fan blades 42 and the number of low pressure turbine rotors is between about 3.3 and about 8.6. The example low pressure turbine 46 provides the driving power to rotate the fan section 22 and therefore the relationship between the number of turbine rotors 34 in the low pressure turbine 46 and the number of blades 42 in the fan section 22 disclose an example gas turbine engine 20 with increased power transfer efficiency.

Figure 2:
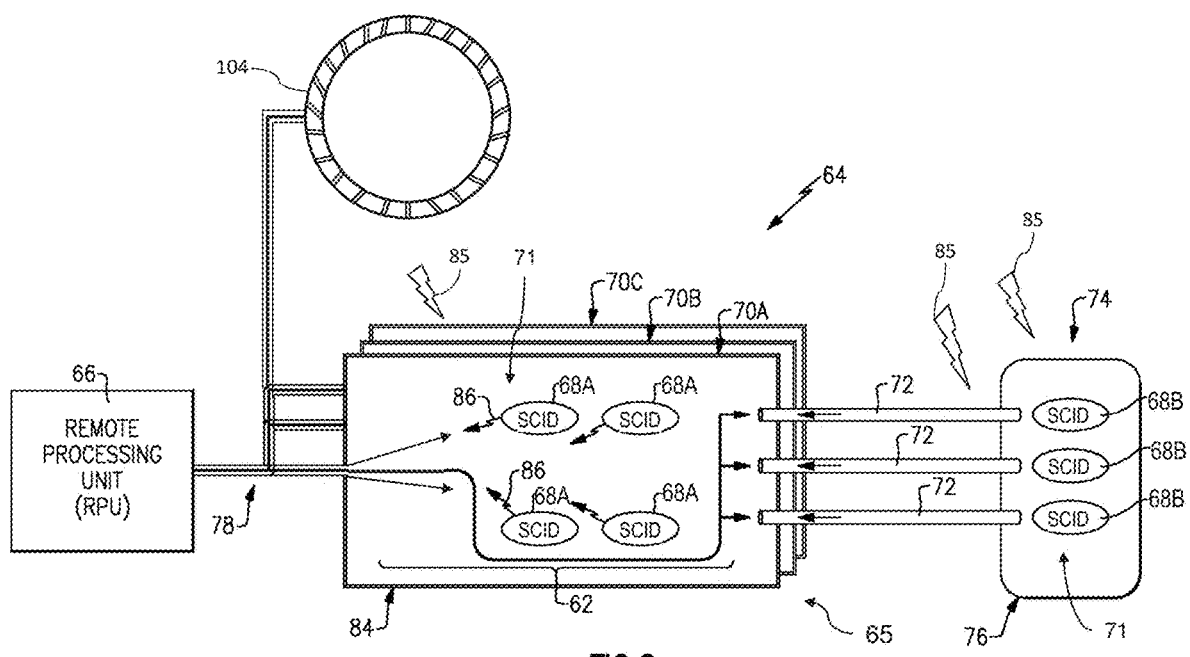
FIG. 2 is a schematic view of an example control and health monitoring system including a shielded electromagnetic network in accordance with an embodiment of the disclosure.

The disclosed example gas turbine engine 20 includes a control and health monitoring system 64 (generally referred to as system 64) utilized to monitor component performance and function. In this example, a sensing/control/identification device (SCID) 68A is located within a sub-system component (SSC) 70. The SCID 68A communicates with electromagnetic energy to a remote processing unit (RPU) 66 through a path comprised of a transmission path 78 and a path 62 within a SSC 70 as best seen in FIG. 2. The path may also be extended along one or more shielded paths 72 to remote SCIDs 68B in separate SSCs 74 (FIG. 2). This entire path (e.g., transmission path 78, path 62, and shielded paths 72) comprises a shielded electromagnetic network (SEN) 65. The RPU 66 may transmit signals to a network 71 of the SCID 68A, 68B (FIG. 2) and/or receive information indicative of current operation of the component being monitored. The transmission media for any portion of the SEN 65 may include solid, liquid, or gaseous material. In this example, a pressure internal to the SSC 70 is monitored and that information transmitted through the path 62 of the SEN 65 to the RPU 66 for use in controlling engine operation or monitoring component health. However, it should be understood that it is within the contemplation of this disclosure that the disclosed system 64 may be utilized to control and/or monitor any component function or characteristic of a turbomachine or aircraft component operation and/or other machines.

Prior control & diagnostic system architectures utilized in various applications include centralized system architecture in which the processing functions reside in an electronic control module. Redundancy to accommodate failures and continue system operation systems are provided with dual channels with functionality replicated in both control channels. Actuator and sensor communication is accomplished through analog wiring for power, command, position feedback, sensor excitation and sensor signals. Cables and connections include shielding to minimize effects caused by electromagnetic interference (EMI). The use of analog wiring and the required connections limits application and capability of such systems due to the ability to locate wires, connectors, and electronics in small and harsh environments that experience extremes in temperature, pressure, and/or vibration.

Referring to FIG. 2, system 64 includes SEN 65 installed near, in, or on each of several SSCs 70A-C, as examples of the SSC 70 of FIG. 1. Each of the SSCs 70A-C may be an engine component, actuator, or any other machine part from which information and communication is performed for monitoring and/or control purposes. In this example, each of the SSCs 70A-C includes a path 62 of the SEN 65 that is the primary means of communicating with one or multiple features of the particular SSC 70A-C or remotely located SSCs 74. The remotely located SSCs 74 may contain a single or multiple electronic circuits or sensors configured to communicate over the SEN 65.

The RPU 66 sends and receives power and data to and from the SSCs 70A-C and may also provide a communication link between different SSCs 70A-C. The RPU 66 may be located on equipment near other system components or located remotely as desired to meet application requirements.

A transmission path (TP) 78 between the RPU 66 and SSCs 70A-C is used to send and receive data routed through the RPU 66 from a control module or other components. The TP 78 may utilize electrical wire, optic fiber, waveguide, or any other electromagnetic communication including radio frequency/microwave electromagnetic energy, visible, or non-visible light. The interface between the TP 78 and SSC 70A-C transmits power and signals received through the TP 78 to one or multiple SCIDs 68A in the example SSC 70A.

The example SCIDs 68A, 68B may be radio-frequency identification (RFID) devices that include processing, memory, and/or the ability to connect to conventional sensors or effectors such as solenoids or electro-hydraulic servo valves. The SSC 70A may contain radio frequency (R/F) antennas, magnetic devices, or optic paths designed to be powered and/or communicate to and/or from the TP 78 paths. The SSCs 70A-C may also use shielded paths 72 that can be configured as any type of electromagnetic communication, including, for instance, radio frequency, microwaves, magnetic, or optic waveguide transmission to the SCIDs 68B located within the remotely located SSCs 74.

Shielding 84 within and around the SSC 70A is provided such that electromagnetic energy or light interference 85 with electromagnetic signals 86 (shown schematically as arrows) within the SSC 70A are mitigated. Moreover, the shielding 84 provides that the signals 86 are less likely to propagate into the environment outside the SSC 70A and enable unauthorized access to information. Similarly, remotely located SSCs 74 can each include respective shielding 76 to limit signal propagation to shielded paths 72. In some embodiments, confined electromagnetic radiation is in the range 1-100 GHz. Electromagnetic radiation can be more tightly confined around specific carrier frequencies, such as 3-4.5 GHz, 24 GHz, 60 GHz, or 76-77 GHz as examples in the microwave spectrum. A carrier frequency can transmit electric power, as well as communicate information, to multiple SCIDs 68A, 68B using various modulation and signaling techniques.

RFID, electromagnetic, or optical devices implemented as the SCIDs 68A, 68B can provide information indicative of a physical parameter, such as pressure, temperature, speed, proximity, vibration, identification, and/or other parameters used for identifying, monitoring, and/or controlling component operation. The SCIDs 68A, 68B may also include control devices such as a solenoid, switch, or other physical actuation devices. Signals communicated over the TP 78 may employ techniques such as checksums, hash algorithms, shielding, and/or encryption to mitigate cyber security threats and interference.

The disclosed system 64 containing the SEN 65 (e.g., transmission path 78, path 62, and shielded paths 72) provides a communication link between the RPU 66 and multiple SSCs 70A-C, 74. The shielding 84, 76 can be provided along the transmission path 78 and for each SSC 70A-C and 74 such that power and communication signals are shielded from outside interference, which may be caused by environmental electromagnetic or optic interference. Moreover, the shielding 84, 76 prevents intentional interference 85 with communication at each component. Intentional interference 85 may take the form of unauthorized data capture, data insertion, general disruption, and/or any other action that degrades system communication. Environmental sources of interference 85 may originate from noise generated from proximate electrical systems in other components or machinery along with electrostatic fields, and/or any broadcast signals from transmitters or receivers. Additionally, pure environmental phenomena, such as cosmic radio frequency radiation, lightning, or other atmospheric effects could interfere with local electromagnetic communications. Accordingly, the individualized shielding 84, 76 for each of the SSCs 70A-C and 74 prevent the undesired interference with communication. The shielding 84, 76 may be applied to enclosed or semi-enclosed volumes that contain the SCIDs 68.

It should be appreciated that while the system 64 is explained by way of example with regard to a gas turbine engine 20, other machines and machine designs can be modified to incorporate built-in shielding for each monitored or controlled components to enable the use of a SEN. For example, the system 64 can be incorporated in a variety of harsh environment machines, such as an elevator system, heating, ventilation, and air conditioning (HVAC) systems, manufacturing and processing equipment, a vehicle system, an environmental control system, and all the like. The disclosed system 64 includes the SEN 65 that enables consistent communication with electromagnetic devices, such as the example SCIDs 68A, 68B, and removes variables encountered with electromagnetic communications such as distance between transmitters and receiving devices, physical geometry in the field of transmission, control over transmission media such as air or fluids, control over air or fluid contamination through the use of filtering, or isolation and knowledge of temperature and pressure.

The system 64 provides for localized transmission to SCIDs 68A, 68B such that power requirements are reduced. Localized transmission occurs within a shielded volume of each SSC 70A-C, 74 that is designed specifically to accommodate reliable electromagnetic transmission for the application specific environment and configuration. Shielding of localized components is provided such that electromagnetic signals are contained within the shielding 84 for a specific instance of the SSC 70A-C. The system 64 therefore enables communication with one or multiple SCIDs 68 simultaneously. The example RPU 66 enables sending and receiving of power and data between several different SSCs 70A-C and 74. The RPU 66 may be located on the equipment near other system components or located away from the machinery for any number of reasons.

The system 64 provides for a reduction in cable and interconnecting systems to reduce cost and increases reliability by reducing the number of physical interconnections. Reductions in cable and connecting systems further provides for a reduction in weight while enabling additional redundancy without significantly increasing cost. Moreover, additional sensors can be added without the need for additional wiring and connections that provide for increased system accuracy and response. Finally, the embodiments enable a "plug-n-play" approach to add a new SCID, potentially without a requalification of the entire system but only the new component; thereby greatly reducing qualification costs and time.

The TP 78 between the RPU 66 and the SSCs 70A-C utilized to send and receive data from other components may take multiple forms such as electrical wire, optic fiber, radio frequency signals or energy within the visible or non-visible light spectrum. The numerous options for a communication path of the TP 78 enable additional design flexibility. The TP 78 transfers energy to the SSC 70A-C such that one or multiple SCIDs 68A, 68B can be multiplexed over one TP 78 to the RPU 66.

SCIDs 68A, 68B can include RFID devices that may or may not include processing, memory, and/or the ability to connect to conventional sensors. Radio frequency (R/F) antennas, magnetic devices, or optic paths within the SSCs 70A-C may be designed to communicate with one or multiple SCIDs 68A, 68B. Moreover, R/F, microwave, magnetic, or optic waveguide transmission paths 72 can be utilized to communicate with individual electromagnetic devices remotely located from the SSC 70A-C.

Shielding 84, 76 within and around the SSC 70A-C, 74 substantially prevents electromagnetic energy or light interference with signals and also makes it less likely that signals can propagate into the surrounding environment to prevent unauthorized access to information.

According to embodiments, electromagnetic (EM) communication with the system 64 can be performed through multi-material and functional/structural components including, for instance, fuel, oil, engineered dielectrics, and enclosed free spaces. By forming waveguides through existing machine components and using electromagnetic communication for one or more of the TP 78, path 62, and/or shielded paths 72, system contaminants and waveguide size for given frequencies can be reduced.

In embodiments, existing components of the gas turbine engine 20 of FIG. 1 can be used to act as waveguides filled with air, fluids, or a specifically implemented dielectric to transmit EM energy for writing and reading to/from EM devices in a Faraday cage protected environment. Use of existing structure can allow waveguide channels to be built in at the time of manufacture by machining passages or additively manufacturing waveguide channels as communication paths. For example, communication paths can be built into the structure of SSCs 70A-C and 74 to guide EM energy through each component. The SSCs 70A-C and 74 may contain gas such as air at atmospheric pressure or any other level, or liquids such as oil or fuel. In any part of the system 64, a dielectric may be employed to resist contamination or to reduce requirements for waveguide dimensions.

Figure 3:
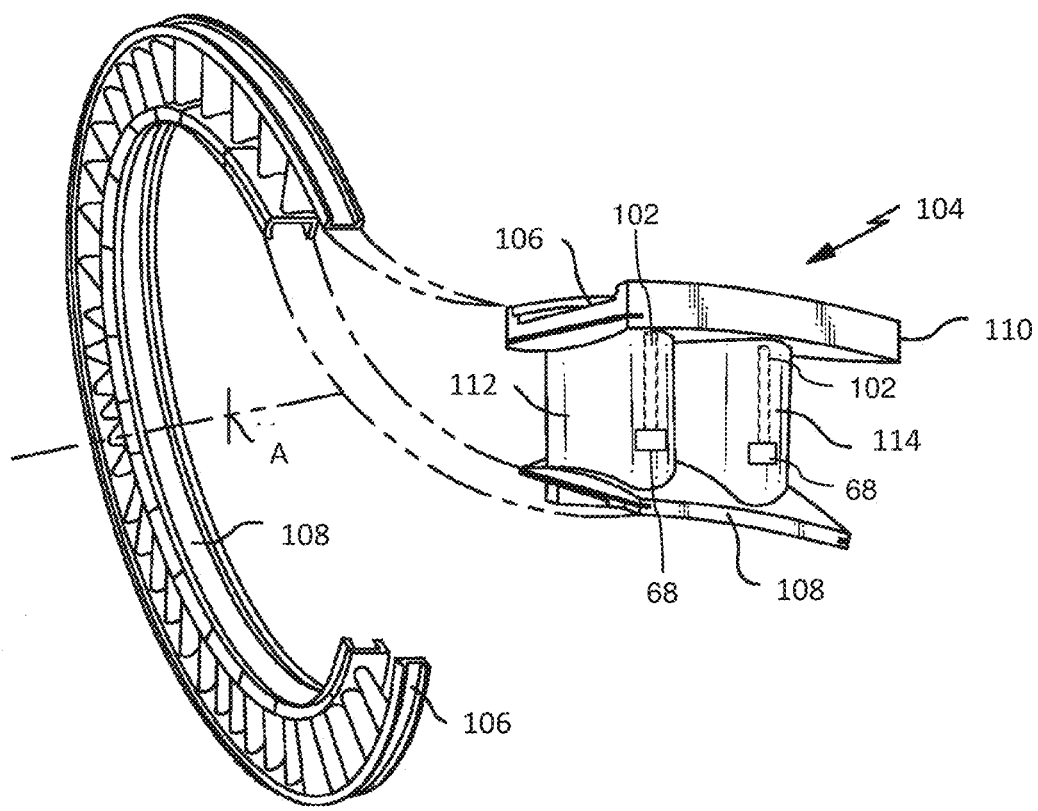
FIG. 3 is a schematic view of a communication path through a component in accordance with an embodiment of the disclosure.

Various machine components may also be used for transmission if the proper waveguide geometry is designed into the component, which can also provide functional and structural aspects of the machine. Examples, such as machine housings, fluid (including air) fill tubes, hydraulic lines, support frames and members, internal machine parts and moving parts that can be coupled to or shaped into waveguide geometry may also be incorporated in embodiments. As one example, FIGS. 2 and 3 depict a plurality of compressor vane segments 104 of the compressor section 24 of FIG. 1 that incorporate one or more communication paths 102 integrally formed in/on a component of the gas turbine engine 20 of FIG. 1. Each communication path 102 can route a portion of electromagnetic signals communicated from the TP 78 to one or more of the SCIDs 68 of FIG. 3. Each communication path 102 also provides a potentially alternate route in which the electromagnetic signal can be channeled in the event of a line or linkage failure, thereby building in inherent redundancy and system level robustness.

In the example of FIG. 3, a compressor vane segment 104 includes an arcuate outer vane platform segment 106 and an arcuate inner vane platform segment 108 radially spaced apart from each other. The arcuate outer vane platform segment 106 may form an outer portion and the arcuate inner vane platform segment 108 may form an inner portion to at least partially define an annular compressor vane flow path.

Communication path 102 in a vane 112 can be formed during a manufacturing process to directly carry electromagnetic signaling of the TP 78 through a component of the gas turbine engine 20 of FIG. 1 directly to a SCID 68 depicted in FIG. 3. Communication path 102 can also terminate with SCIDs 68 to read pressures, temperatures, or other parameters at the end of the TP 78 or 72. Waveguide usage can enable very low transmission losses such that the RPU 66 of FIG. 2 can be physically located much farther away from the SCIDs 68A, 68B of FIG. 2 than conventional free space transmitting devices. Use of a dielectric in the waveguides can reduce the dimensional requirements for the waveguides and resist contaminants, such as moisture, particles, gases, corrosion, and/or liquids that may increase transmission losses. Embodiments can use fluids in existing systems to act as a dielectric, particularly fluids with a dielectric constant that approaches or is better than free space. Thus, existing fuel or oil lines of the gas turbine engine 20 of FIG. 1 may be used as waveguides if they have appropriate dielectric properties.

Figure 4:
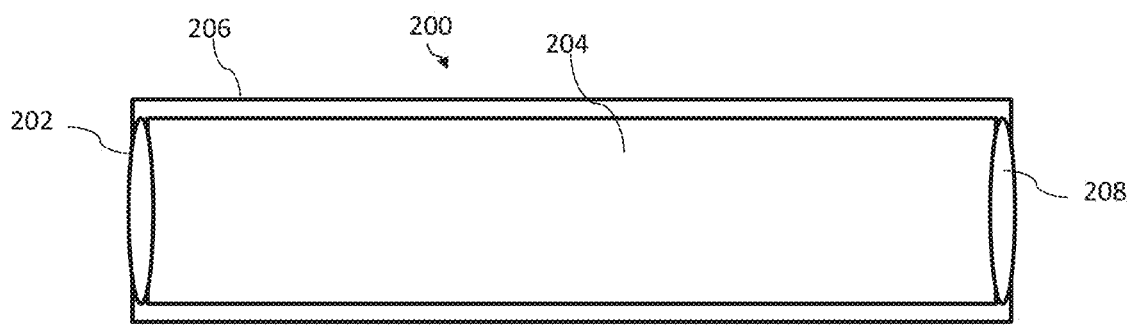
FIG. 4 is a schematic view of a waveguide in accordance with an embodiment of the disclosure.

Further embodiments include allowing transition of EM energy from a waveguide into a free space environment. Some of the SSCs 70A-C, 74 of FIG. 2 have multiple SCIDs 68A, 68B that reside in a protected Faraday cage (e.g., a shielded volume within shielding 84, 76) filled with air or other fluids. Transitioning energy from a waveguide to and from an open cavity is required to prevent unwanted signal loss. Embodiments transition EM energy from TP 78 into a free space environment containing either air or a fluid within shielding 84 of SSC 70A of FIG. 2 using an example waveguide 200 of FIG. 4. The waveguide 200 may be an embodiment of the TP 78 or the shielded path 72 of FIG. 2. In some embodiments, EM energy transitions through multiple interfaces having different environmental characteristics, such as waveguide 250 of FIG. 5 as a further example of the shielded path 72 of FIG. 2. Waveguides 200, 250 can connect multiple SCIDs 68 and may pass through existing components, for instance, in communication path 102 of FIG. 3, to facilitate transmission of EM power and signaling between devices. The waveguides 200, 250 may incorporate "T"s, "Y"s, splitters or other branching types to facilitate a network topology.

EM energy may be confined to a waveguide, or alternatively can be transmitted through a combination of waveguide and free space communications in a shielded environment, e.g., within shielding 84, 76 of FIG. 2, to meet system requirements for signal attenuation and disturbances. Waveguide 200 of FIG. 4 can include a waveguide transmitter interface 202 that enables electromagnetic signal transmission within a waveguide medium or electromagnetic window 204 in a guidance structure 206 to a waveguide transition interface 208. The waveguide transmitter interface 202 may be an EM energy emitter, and the waveguide transition interface 208 may be operable to pass the EM energy through shaping, an antenna structure, or an active structure to a confined free space within shielding 84, 76 of FIG. 2. The waveguide medium 204 can be a gas or liquid, such as air, oil, fuel, solid dielectric, or the like. In some embodiments, the waveguide medium 204 is a dielectric. The guidance structure 206 can be a metal tube and may be integrally formed in/within a component of the gas turbine engine 20 of FIG. 1, such as communication path 102 of FIG. 3. In other embodiments, the guidance structure 206 is an outer edge of a dielectric and need not include a metallic structure. Although depicted as a single straight path, it will be understood that the waveguide 200 can bend and branch to reach multiple SCIDs 68A, 68B of FIG. 2. In other embodiments, the waveguide 200 may take the form of a planer stripline, or trace on a printed circuit board.

Figure 5:
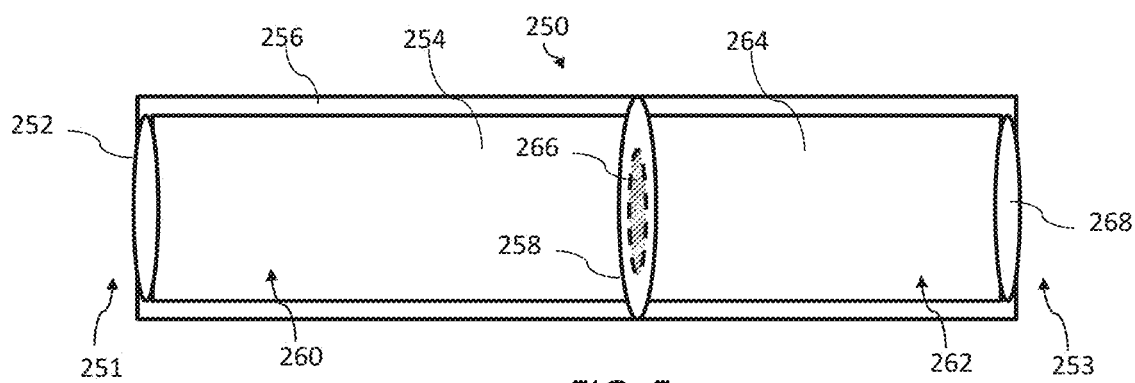
FIG. 5 is a schematic view of another waveguide in accordance with an embodiment of the disclosure.

Transitioning EM energy from a waveguide to and from cavities using TP 78 and/or shielded paths 72 can present a challenge when SCIDs 68A, 68B of FIG. 2 are located in higher temperature or pressure environments, especially in environments containing fuel, oil, flammable liquids, or associated vapors. With further reference to FIG. 5, the waveguide 250 enables transitioning of EM energy from a first environment 251 into a second environment 253 with a higher temperature and/or higher pressure capable barrier against fluids or gasses. Waveguide 250 of FIG. 5 can include a waveguide transmitter interface 252 that enables electromagnetic signal transmission within a guidance structure 256 to a waveguide transition interface 258. The waveguide transmitter interface 252 may be an EM energy emitter in the first environment 251. The waveguide transition interface 258 may be operable to pass the EM energy through shaping, an antenna structure, or an active structure from a first portion 260 of the waveguide 250 to a second portion 262 of the waveguide 250. The first portion 260 of the waveguide 250 may have a first waveguide medium 254 that is different from a second waveguide medium 264 of the second portion 262. A transition window 266 can be incorporated in the waveguide transition interface 258 as a dielectric or thin metal EM window operable to pass a frequency range of interest between the first portion 260 and the second portion 262 of the waveguide 250. The second portion 262 of the waveguide 250 can also include a secondary waveguide transition interface 268 in the second environment 253. The secondary waveguide transition interface 268 can act as a seal to prevent different temperatures and/or pressures of the second environment 253 from directly contacting the first portion 260 of the waveguide 250. The first waveguide medium 254 and the second waveguide medium 264 can be different gasses or liquids, such as air, oil, fuel, or the like and may have different nominal pressures and/or temperatures. In some embodiments, the first waveguide medium 254 and/or the second waveguide medium 264 is a dielectric. The guidance structure 256 can be a metal tube and may be integrally formed on/within a component of the gas turbine engine 20 of FIG. 1, such as communication path 102 of FIG. 3. The guidance structure may also contain more than one waveguide transition interface(s) 258 with a corresponding transition window 266 for redundancy purposes. Although depicted as a single straight path, it will be understood that the waveguide 250 can bend, "T," "Y," and/or branch to reach multiple SCIDs 68A, 68B of FIG. 2.

Figure 6:
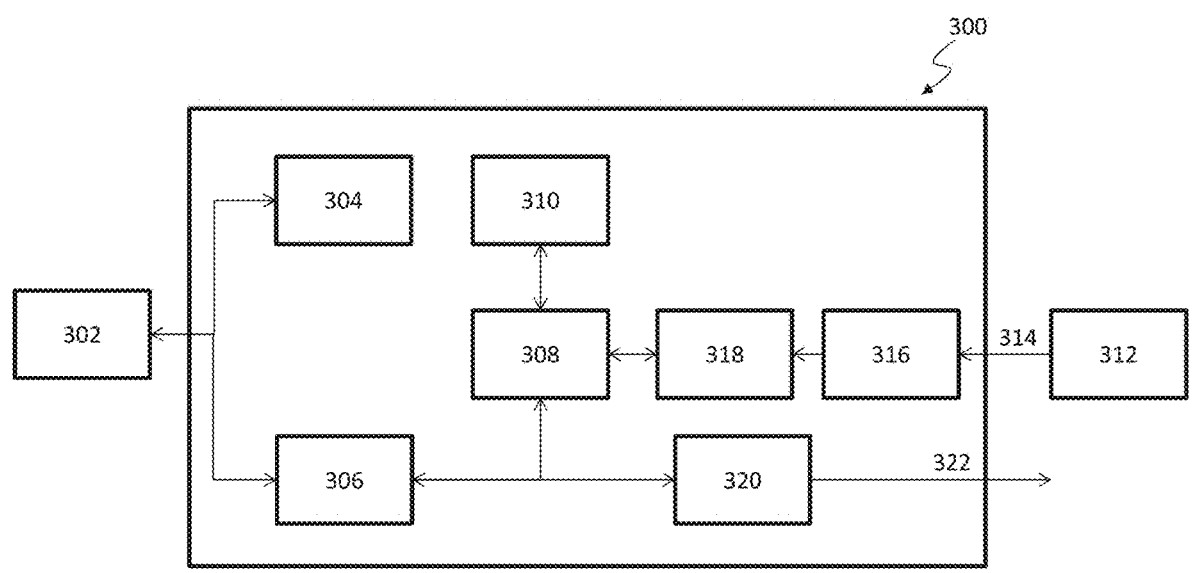
FIG. 6 is a schematic diagram of a sensing/control/identification device configuration in accordance with a non-limiting embodiment of the present disclosure.

Turning now to FIG. 6, a schematic illustration in accordance with an embodiment of the present disclosure is shown. FIG. 6 provides an example illustration for employing EM energy to power and read devices such as sensors or other control devices, e.g., SCIDs 68A, 68B described above. As will be appreciated by those of skill in the art, whether a sensor or control device is wired or wireless, some form of power is required to obtain a sensor reading. With open air wireless devices, batteries or other energy harvesting methods such as thermo-electric, vibrational, and magnetic coupling configurations have been considered. Utilizing free space, EM energy can be implemented in RFID. Open air transmission of wireless energy as applicable to energy harvesting in some machine environments is generally not practical because the energy rapidly attenuates over short distances.

In one non-limiting embodiment, use of the transmission path 78, path 62, and shielded paths 72 in the form of waveguides (e.g., waveguides 200, 250) allows very low transmission losses such that power sources (e.g., RPU 66 of EM devices) can be physically located farther apart as compared to conventional free space transmitting devices. Further, such configurations of the present disclosure can still deliver enough power to energize the SCIDs 68A, 68B.

For example, FIG. 6 schematically represents an SCID 300 (i.e., similar to that shown in FIG. 2). The SCID 300 depicted in FIG. 6 receives energy from an EM transmitting source 302, such as an RPU described above. The SCID 300 includes a rectification and power conditioning module 304 configured to rectify and condition power received from the EM transmitting source 302. The rectified and conditioned power is then provided to each of the other modules of the SCID 300, as described herein (e.g., modules 306, 308, 310, etc.). Although shown as separate modules, the various components and features of the SCID 300 in accordance with the present disclosure can be configured in more or fewer modules, and in one non-limiting embodiment, a single printed circuit board component or a more integrated device implemented on a single package can provide all of the functionality described herein. Thus, FIG. 6 and the nomenclature provided herein is not intended to be limiting or to imply that each module is a separate and distinct unit, but rather is used to convey an operation that can be performed by the same or different components of the SCID 300.

In addition to power processing, the SCID 300 further includes a communication interface module 306 that is configured for communication with the EM transmitting source 302. That is, the communication interface module 306 is configured to receive and process information received in EM transmissions from the EM transmitting source 302. The SCID 300 includes a control module 308, such as a microcontroller, microprocessor, etc. that can be programmed to control and/or communicate with different sensors depending on the application needs. The control module 308 can read and write to a storage module 310, such as memory (e.g., volatile and/or non-volatile memory). The storage module 310 can include identification information associated with SCID 300, programs and/or applications to be executed by the control module 308, or other data. The control module 308 is further configured to receive input from an external sensor(s) 312. The external sensor 312 can provide a sensor input 314 that is input into the SCID 300 at or through a sensor circuit module 316. The sensor circuit module 316 can be an electrical circuit, module, or component that is selected to interact with the external sensor 312, and thus may vary depending on a particular application or sensor configuration. The sensor input 314 is received at the sensor circuit module 316 and then converted at an input conversion module 318 to then be processed at the control module 308. In one non-limiting embodiment, the control module 308 can be a microcontroller that is configured to read the sensor input 314 through the conversion module 318, which may be an analog-to-digital converter, frequency-to-digital converter, or any other converter that translates physical measurements to digital form. Further, in some non-limiting embodiments, the SCID 300 can include an optional control output module 320 that can, for example, process and convert instructions or commands from the control module 308 into analog signals and generate an output signal 322. The output signal 322 can be a transmission or signal sent from the SCID 300 to the external sensor 312 for excitation or to some other external component or device (e.g., a different SCID, an actuator, a sub-system component (SSC) 70, etc.).

The power rectification and conditioning module 304 has the ability to harvest energy from EM signals to power the modules of the SCID 300. Close proximity of the SCID 300 to the EM transmitting source 302 is not required due to the power levels of the EM energy delivered by the waveguides (e.g., waveguides 200, 250). Further, the SCID 300 has the ability to perform communications through the communication interface module 306. Moreover, the SCID 300 has the ability to read sensors 312 connected to the sensor circuit module 316. Furthermore, the SCID 300 has the ability to write information to and read information from the storage module 310. In some embodiments, the SCID 300 can be configured to send signals 322 (e.g., analog signals) to an external device. Moreover, the SCID 300 has practical immunity from wireless cyber security attacks, EMI, etc. due to Faraday shielding provided about the SCID 300, as described above. Furthermore, in some embodiments, the SCIDs 300 can be multiplexed for communication purposes, as will be appreciated by those of skill in the art.

Figure 7:
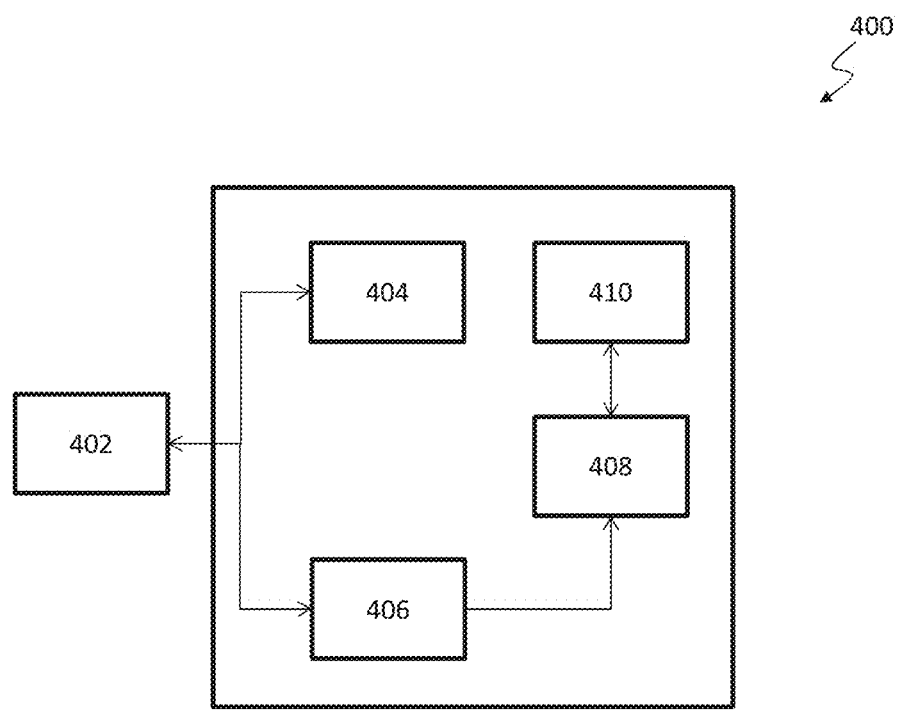
FIG. 7 is a schematic diagram of another sensing/control/identification device configuration in accordance with a non-limiting embodiment of the present disclosure.

Turning now to FIG. 7, another schematic illustration of an SCID 400 in accordance with an embodiment of the present disclosure is shown. The SCID 400 is a partial schematic, and those of skill in the art will appreciate that features described with respect thereto can be incorporated into any SCID in accordance with the present disclosure, or the features can be separately provided in a dedicated SCID, depending on the system requirements and needs. In the embodiments of FIG. 7, the SCID 400 is configured to store identification data, characterization data, and/or operational use data for control components. The control components could be actuators, valves, or sensor systems/sub-systems that vary slightly in characteristics between different parts. Accordingly, the SCID 400 can include various features described above with respect to FIG. 6, but such features are not shown for simplicity.

As will be appreciated by those of skill in the art, mechanical components manufactured to the same design specifications do not always perform identically when installed in an operational machine (e.g., aircraft engines, etc.), both initially and over time. Such variability may be caused by an inability to manufacture parts with no variance or differences (e.g., there may always be some amount of variation in any given process). Furthermore, in addition to manufacturing variability, over time various components may drift from operational metrics differently compared to initial states of the components (e.g., one component may degrade faster or slower than another component). Such variation causes loss in precision of machine operation and may cause additional energy consumption or drift in fault detection indicators due to off nominal operation scheduled by a control system.

Various component variability (particularly manufacturing variability) can be determined at the time of manufacture. For example, in the aerospace industry, variability in components can be determined and recorded during acceptance testing before a product or component is shipped or finally installed. Such initial information can be useful in calibration of a final part or machine into which the component is installed. For example, such information that is component-specific can be used to fine-tune the machine, and further can be used to automatically tune or adjust operational parameters or other control or operational factors to accommodate component variability.

Furthermore, as noted, component operation can vary significantly over time, for example due to environmental factors, operator usage profiles, and/or unexpected events that occur during equipment operation. Knowledge of the usage for each component can be useful in knowing when a component is operating off-specification or when maintenance action may be required or otherwise recommended. With current state-of-the-art systems, much of this information can be captured using various sensors or other equipment, as known in the art. However, such recorded data and information is typically stored in other components that are physically separate from the component (e.g., SCID), making life-usage tracking or troubleshooting at a component supplier very difficult.

In the present disclosure and in particular the embodiment shown in FIG. 7, an SCID 400 can communicate with an EM transmitting source 402, such as an RPU. The RPU can receive information from the SCID 400 to obtain calibration information and/or other data related to the SCID 400. Such configuration can be used for multiple SCIDs 400 (e.g., each control component 70A-C, 74 shown in FIG. 2). FIG. 7 illustrates a non-limiting implementation and configuration of an SCID 400. The SCID 400 in FIG. 7 is configured to receive energy from the EM transmitting source 402, and then can rectify and condition the power using a rectification and power conditioning module 404. The rectified and conditioned power can then be supplied to each of the other modules within the SCID 400. In the embodiment of FIG. 7, similar to that of FIG. 6, a communication interface module 406 is configured to communicate with the EM transmitting source 402 (e.g., RPU) and also retrieve and store information into a storage module 410 through a control module 408. The control module 408 can be programmed to characterize different control components depending on application needs. For example, various characterization curves can be stored in the storage module 410 and can include flow rates versus valve position(s) and temperature, flow versus pressure drop and temperature, etc.

During operation of the SCID 400 in this configuration, the storage module 410 can also store information about various other information, including, but not limited to, an engine installation, flight profiles, and/or important environmental data from other components that may be communicated over the EM communication interface (e.g., from the EM transmitting source 402 or from other sources). Such information can be supplied by a control and health monitoring system and/or other control systems or component and written to the storage module 410 in a particular SCID 400 of a control component.

Such configuration can enable the ability to communicate with EM transmitting sources (e.g., RPUs) for sending and receiving calibration data, life usage data, environmental data, etc. Furthermore, embodiments of such configuration can enable the ability to utilize calibration data to fine tune control and diagnostic algorithms that utilize the control component. Moreover, various embodiments can store fault information data for components and thus enable monitoring for maintenance (e.g., removal, repair, replacement, etc.). Additionally, embodiments provided herein can provide an ability to associate the stored data in the control component (e.g., within the storage module 410) with the proper control component and thus a technician can obtain historical information or data related to the control component. Furthermore, advantageously, embodiments provided herein can provide an ability to characterize and/or track a single device or multiple devices that are grouped together in the same hardware component that may be physically combined with the EM device and thus provide, for example, detailed data and/or maintenance information. Moreover, in some embodiments, each SCID 400 can be configured to supply or otherwise announce identification information to a separate controller or other EM transmitted device when the SCID 400 is connected to an EM network (e.g., self-identifying and reporting of the SCID).

Figure 8:
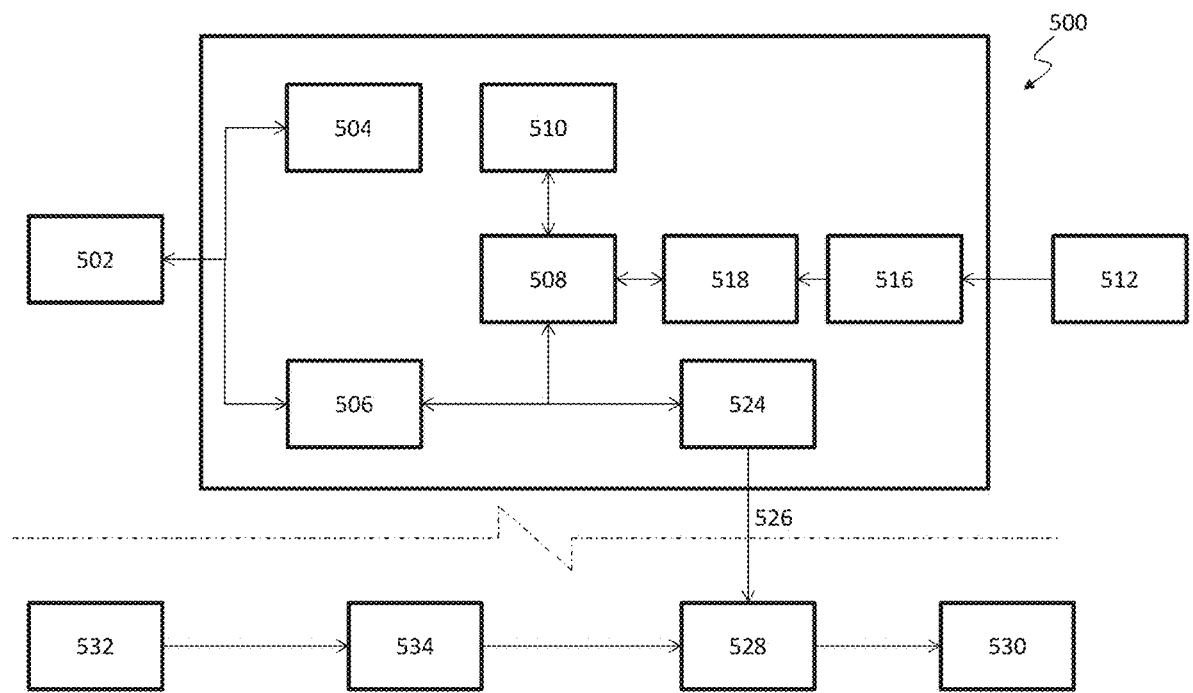
FIG. 8 is a schematic diagram of another sensing/control/identification device configuration in accordance with a non-limiting embodiment of the present disclosure.

Turning now to FIG. 8, another configuration of an SCID 500 in accordance with an embodiment of the present disclosure is shown. The embodiment shown in FIG. 8 can be combined with one or more of the above described features and/or can form a distinct SCID 500. The SCID 500 is configured to use EM energy to power and read devices that control effectors using an externally provided power bus.

As noted above, whether sensors or control devices are wired or wireless, some form of power is required to obtain sensor readings and power effectors such as electro-hydraulic servo valves (EHSV), direct drive valves (DDV), solenoids, etc. Such effectors may require relatively high power levels to control, e.g., compared to the more passive features described above, or as compared to other prior configurations as known in the art. Accordingly, power for effectors such as EHSVs, DDVs, solenoids, etc. must come from other sources than an SCID.

However, in accordance with embodiments provided herein, power for effectors can be provided from and/or switched from the SCID 500. The SCID 500 can be similar to that described above, including an EM transmitting source 502, a rectification and power conditioning module 504, a communication interface module 506, a control module 508, a storage module 510, a sensor circuit module 516, an input conversion module 518, and can be in communication with an external sensor 512. In contrast to the above described embodiments, the SCID 500 includes a power output module 524. Those of skill in the art will appreciate that the various features of the SCID 500 can be mixed and matched with the other embodiments of the present disclosure, and FIG. 8 is not intended to be limiting.

Use of waveguides in accordance with the present disclosure, and described above, allows very low transmission losses such that power sources, such as EM transmitting sources, can be physically located much further than conventional free space transmitting devices and still deliver enough power to energize the SCID 500. The SCID 500 depicted in FIG. 8 receives energy from an EM transmitting source 502, rectifies and conditions the power in the rectification and power conditioning module 504 and provides the conditioned power to each of the other sections (e.g., modules 508, 510, 518, 516, etc.). The control module 508 is responsible for communicating with the EM transmitting source 502, retrieving and storing information in the storage module 510, reading the sensor inputs from the external sensor(s), if employed, through the sensor circuit module 516 and the input conversion module 518. Further, the SCID 500 is configured to supply output signals 526 through the power output module 524, which can provide analog signals (e.g., D/A converted signals), pulse width modulations (e.g., through a pulse-width modulation converter), etc.

The output signals 526 can be provided to one or more power switching devices 528 that are external from the SCID 500. The power switching devices 528 can be configured to deliver a power switching control signal to an electromechanical device 530 (e.g., EHSV, DDV, solenoid, etc.). The power switching devices 528 can receive higher required power levels from an optic or electric power bus 532 after passing through a power conditioning circuit 534. As noted above, the control module can be programmed to handle different sensors depending on the application needs and further can be programmed to handle and/or control different electromechanical devices.

The non-limiting embodiment and features shown and described in FIG. 8 enable configurations where close proximity of the SCID 500 with power sources is not required due to the power levels of the EM energy delivered by the waveguides. Further, the control module 508 of the SCID 500 can provide the ability to receive electrical or optic power from a power bus 532 and convert it to a suitable power source for an EHSV, DDV, solenoid, or other electromechanical device 530. Further, the SCID 500 can provide an ability to control power output to the electromechanical devices 530 by sending low level D/A, Pulse Width Modulation (PWM) signals, or any other suitable form of signal to the power switching devices for a switching operation.

Figure 9:
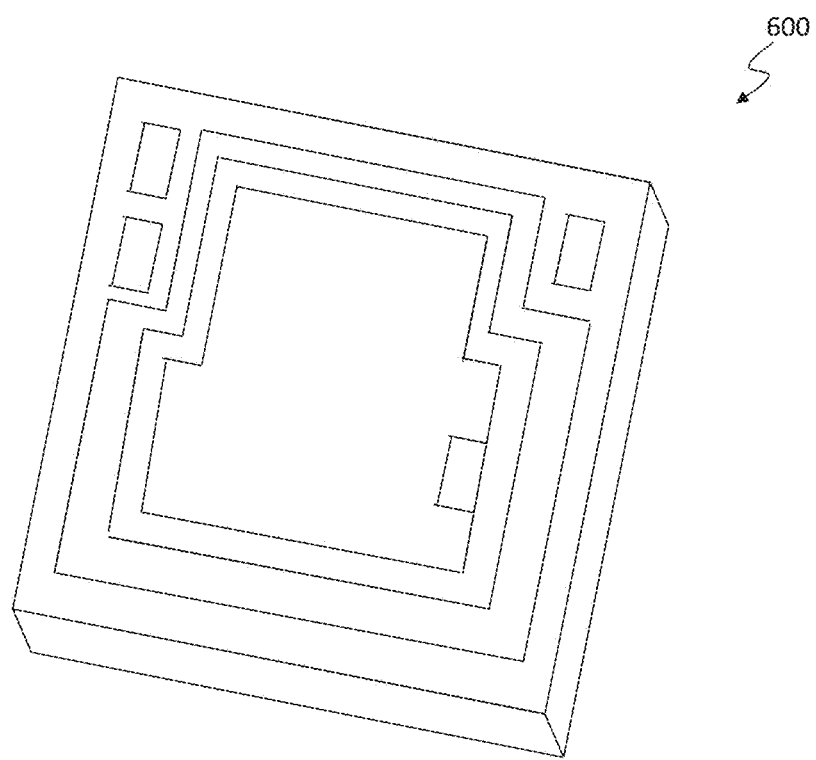
FIG. 9 is a schematic illustration of an on-chip antenna employed with embodiments of the present disclosure.

Turning now to FIG. 9, an example of an on-chip antenna 600 for use with embodiments of the present disclosure is schematically shown. The on-chip antenna 600 enables EM devices for power transfer and communication with a host or peer devices, as described above.

The free space wavelength of EM radiation is given as $\lambda=c/v$; where c is the speed of light in air ($3\times10^8$ m/s) and v is the frequency in Hz. Hence at 10 GHz, the wavelength is 3 cm, and at 24 GHz the wavelength is approximately 1 cm. This is without the presence of a dielectric, which could diminish the size wavelength inversely proportional to the square root of the dielectric constant, i.e., $\lambda_{dielectric}=\lambda_{free\ space}/(\varepsilon)^{1/2}$. For materials with a dielectric of ~10, this diminishes the wavelength and hence size of the antenna which is on the order of the size of the wavelength.

FIG. 9 is an example of an on-chip antenna 600, whose functionality is to absorb EM radiation and can be employed with SCIDs shown and described herein. In some non-limiting embodiments, the on-chip antenna 600 is designed to be capable of receiving EM radiation, rectifying the EM radiation (e.g., rectifying power), and turning it into a power source for the device (e.g., operate as a rectification and power conditioning module of an SCID shown and described above). Concurrently, the on-chip antenna 600 may be configured to efficiently transmit EM radiation back out of the device (e.g., the SCID). Accordingly, in some configurations, the on-chip antenna and the chip itself (e.g., the complete SCID) can be co-designed to be both an efficient absorber and radiator (e.g., receive and transmit EM radiation).

In one non-limiting example, the on-chip antenna 600 can be designed to operate at various frequencies. For example, the on-chip antenna 600 can be configured to operate at various frequencies or ranges of frequencies, including, but not limited to 1-100 GHz, 3-4.5 GHz, 10 GHz, 24 GHz, 60 GHz, or 76-77 GHz. In various embodiments, the EM radiation can be rectified and the EM energy used to power an RFID designed to operate at such a frequency. Advantageously, embodiments of the present disclosure enable an antenna that is integrated onto the surface of a device (e.g., SCID) that both powers the device and efficiently radiates back at a power reception frequency. Further, in some embodiments, the on-chip antenna 600 can have an integrated dielectric for smaller size, and thus provide additional benefits.

In some embodiments, the on-chip antenna 600 can have an isolated ground plane for high efficiency. Moreover, in some non-limiting embodiments, the on-chip antenna 600 can be composed of a non-oxidizing metal such as gold, platinum, stainless steel, titanium, etc. Furthermore, a dielectric can be used to enable miniaturize the size of the on-chip antenna 600. Due to optimized size and shape, the placement of the on-chip antenna 600 on the device, and subsequently the placement of the device itself, can be made so that the orientation of the on-chip antenna 600 maximizes EM absorption and transmission. Furthermore, in accordance with some embodiments, the on-chip antenna can be designed and/or otherwise configured for selective polarization, or mode, whether the mode is primarily magnetic or electric, and further can be designed to operate internal to a waveguide structure.

In the system described, SCIDs 300, 400, 500 include materials suited to the operation environment. In some embodiments the SCIDs 300, 400, 500 include one or more semiconductor devices formed using high temperature compatible semiconductor materials. The operation environment for at least a portion of the SCIDs can be a high temperature environment, operating at temperatures of greater than 200° C. At these temperatures, silicon is not an effective semiconductor. At temperatures greater than 200° C. the SCID can include a wide band gap semiconductor, for example, silicon on insulator (SOI), silicon carbide (SiC) or gallium nitride (GaN), boron nitride, aluminum nitride, or combinations comprising at least one of the foregoing as the semiconductor material. When a device utilizes a wide band gap semiconductor as the semiconductor material the device is referred to herein as a wide band gap semiconductor device.

In some embodiments the SCID and/or the wide band gap semiconductor device includes an integrated device having: bipolar junction transistors, field effect transistors, or a combination thereof. This combination can be in the form of elements on a printed circuit board or integrated holistically into a single application specific integrated circuit; and variations thereof.

Conventional silicon based integrated circuit SCIDS may be used for most near room temperature devices; however, for progressively higher temperature applications one must use alternate semiconductor structures and even alternative materials. Alternative materials include silicon on insulator (SOI), silicon carbide (SiC), gallium nitride (GaN), diamond, boron nitride, aluminum nitride, or combinations comprising at least one of the foregoing. The wide band gap semiconductor devices can be simple bipolar structures, MOSFETs, JFETs, light emitting diodes (LEDs), oscillators, diodes, their variants, and combinations comprising at least one of the foregoing. These devices can be configured together to create up-integrated circuits, and then still further integrated to systems on chip (SIC), system in a package (SIP) and similar descriptors entailing integration of the like.

Figure 10:
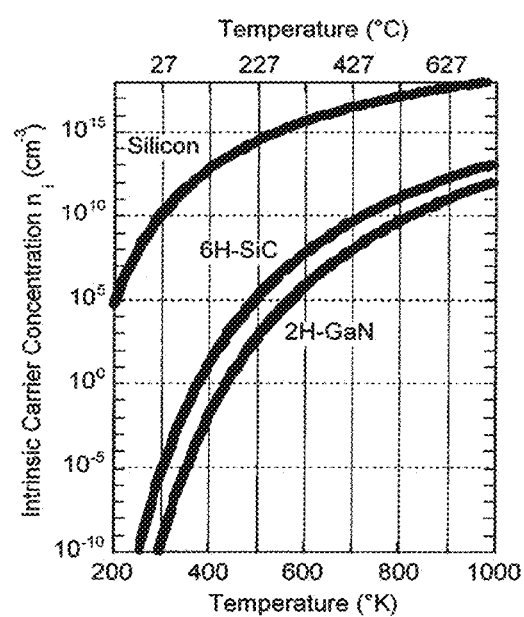
FIG. 10 is a graph depicting temperature capability of various semiconductor materials and their thermal limitations.

At the frequencies and high temperatures of SCIDS 300, 400, 500 mentioned previously, silicon semiconductors would be subject changes that would preclude operation in environments that exceed 100° C. SOI semiconductors have potential capability to 300° C., but neither are suitable for machines temperatures that reach 500° C. FIG. 10 shows the temperature capability of SiC and GaN due to the low intrinsic carrier concentration at elevated temperatures. Silicon based devices would have high leakage above approximately 150° C. due to excitation of intrinsic carriers thereby significantly reducing the functionality of these devices. However, gas turbine engine environments can range from ambient temperatures to 1000° C. even without total immersion into the combustion process. Consequently, wide bandgap based semiconductor devices offer a means to realize the SCIDs architecture and components described in 300, 400, 500.

Use of wide band gap materials can also enable the integration of on-chip antennas 600 to reduce size and increase reliability of SCIDs 300, 400, 500.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

What is claimed is:

1. A system of a machine, the system comprising:
   a network of a plurality of sensing/control/identification devices distributed throughout the machine, each of the sensing/control/identification devices associated with at least one sub-system component of the machine and operable to communicate through a plurality of electromagnetic signals;
   shielding within or around at least one of the sensing/control/identification devices to contain the electromagnetic signals proximate to the at least one sub-system component;
   a communication path integrally formed in a component of the machine to route a portion of the electromagnetic signals through the component; and
   a remote processing unit operable to communicate with the network of the sensing/control/identification devices through the electromagnetic signals, wherein at least a portion of the sensing/control/identification devices comprise a wide band gap semiconductor device.

2. The system as recited in claim 1, wherein the wide band gap semiconductor device comprises silicon on insulator (SOI), silicon carbide (SiC), gallium nitride (GaN), boron nitride, aluminum nitride, or a combination comprising at least one of the foregoing.

3. The system as recited in claim 1, wherein the wide band gap semiconductor device operates at a temperature greater than 200 degrees C.

4. The system as recited in claim 1, wherein the wide band gap semiconductor device comprises an integrated device having bipolar junction transistors, field effect transistors, or a combination comprising at least one of the foregoing.

5. The system as recited in claim 1, wherein the wide band gap semiconductor device comprises a bipolar structure, MOSFET, JFET, light emitting diode, oscillator, diode or a combination comprising at least one of the foregoing.

6. The system as recited in claim 1, wherein the wide band gap semiconductor device is part of an integrated circuit.

7. The system as recited in claim 1, wherein the communication path formed in the component of the machine comprises a waveguide.

8. A system for a gas turbine engine, the system comprising:
- a network of a plurality of sensing/control/identification devices distributed throughout the gas turbine engine, each of the sensing/control/identification devices associated with at least one sub-system component of the gas turbine engine and operable to communicate through a plurality of electromagnetic signals;
- shielding within or around at least one of the sensing/control/identification devices to contain the electromagnetic signals proximate to the at least one sub-system component;
- a communication path integrally formed in a component of the gas turbine engine to route a portion of the electromagnetic signals through the component; and
- a remote processing unit operable to communicate with the network of the sensing/control/identification devices through the electromagnetic signals, wherein at least a portion of the sensing/control/identification devices comprise a wide band gap semiconductor device.

9. The system as recited in claim 8, wherein the wide band gap semiconductor device comprises silicon on insulator (SOI), silicon carbide (SiC) or gallium nitride (GaN), boron nitride, aluminum nitride, or a combination comprising at least one of the foregoing.

10. The system as recited in claim 8, wherein the wide band gap semiconductor device operates at a temperature greater than 200 degrees C.

11. The system as recited in claim 8, wherein the wide band gap semiconductor device comprises an integrated device having bipolar junction transistors, field effect transistors, or a combination comprising at least one of the foregoing.

12. The system as recited in claim 8, wherein the wide band gap semiconductor device comprises a bipolar structure, MOSFET, JFET, light emitting diode, oscillator, diode or a combination comprising at least one of the foregoing.

13. The system as recited in claim 8, wherein the wide band gap semiconductor device is part of an integrated circuit.

14. The system as recited in claim 8, wherein the communication path formed in the component of the gas turbine engine comprises a waveguide.

15. A method of electromagnetic communication through a machine, the method comprising:
- transmitting communication signals between a remote processing unit and a network of a plurality of control/sensing/identification devices in the machine using a plurality of electromagnetic signals wherein the plurality of electromagnetic signals pass through a waveguide integral to a component of the machine and provide power to the control/sensing devices and further wherein the at least a portion of the control/sensing/identification devices comprise a wide band gap semiconductor device.

16. The method as recited in claim 15, wherein the wide band gap semiconductor device comprises silicon on insulator (SOI), silicon carbide (SiC), gallium nitride (GaN), boron nitride, aluminum nitride, or a combination comprising at least one of the foregoing.

17. The method as recited in claim 15, wherein the wide band gap semiconductor device operates at a temperature greater than 200 degrees C.

18. The method as recited in claim 15, wherein the wide band gap semiconductor device comprises an integrated device having bipolar junction transistors, field effect transistors, or a combination comprising at least one of the foregoing.

19. The method as recited in claim 15, wherein the wide band gap semiconductor device is part of an integrated circuit.

20. The method as recited in claim 19, wherein the wide band gap semiconductor device comprises silicon carbide (SiC), gallium nitride (GaN) or a combination thereof.

* * * * *